(12) United States Patent
Lee (10) Patent No.: US 12,306,542 B2
(45) Date of Patent: May 20, 2025

(54) IMMERSION EXPOSURE TOOL (71) Applicant: Taiwan Semiconductor Manufacturing Company, Ltd., Hsinchu (TW)

(72) Inventor: Yung-Yao Lee, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/609,433

(22) Filed: Mar. 19, 2024

(65) Prior Publication Data

US 2024/0231240 A1 Jul. 11, 2024

Related U.S. Application Data

(63) Continuation of application No. 17/248,394, filed on Jan. 22, 2021, now Pat. No. 11,966,165.

(51) Int. Cl.
| | | |
|---|---|---|
| *G03F 7/00* | (2006.01) |
| *C09D 1/00* | (2006.01) |
| *C09D 5/00* | (2006.01) |
| *C23C 14/06* | (2006.01) |
| *C23C 14/08* | (2006.01) |
| *C23C 16/34* | (2006.01) |
| *C23C 16/40* | (2006.01) |

(52) U.S. Cl.
CPC ........... *G03F 7/70316* (2013.01); *C09D 1/00* (2013.01); *C09D 5/00* (2013.01); *C23C 14/0652* (2013.01); *C23C 14/0694* (2013.01); *C23C 14/08* (2013.01); *C23C 16/345* (2013.01); *C23C 16/40* (2013.01); *G03F 7/70341* (2013.01)

(58) Field of Classification Search
CPC ... G03F 7/70341; G03F 7/70316; C09D 5/00; C23C 14/0652; C23C 14/0694; C23C 16/345; C23C 16/40
See application file for complete search history.

(56) References Cited

U.S. PATENT DOCUMENTS

| | | | |
|---|---|---|---|
| 7,460,206 B2 | 12/2008 | Weissenrieder et al. |
| 7,705,966 B2 | 4/2010 | Sakai et al. |
| 8,208,124 B2 | 6/2012 | Loopstra et al. |
| 9,046,796 B2* | 6/2015 | Shirai | G03F 7/70958 |
| 9,158,207 B2 | 10/2015 | Weippert |
| 10,175,582 B2 | 1/2019 | Pilz et al. |
| 10,324,382 B2 | 6/2019 | Kunnen et al. |

(Continued)

FOREIGN PATENT DOCUMENTS

| | | |
|---|---|---|
| TW | 200941613 A | 10/2009 |
| TW | 201310176 A | 3/2013 |
| TW | 201314378 A | 4/2013 |

*Primary Examiner* — Hung V Nguyen
(74) *Attorney, Agent, or Firm* — Harrity & Harrity, LLP (57) ABSTRACT

A bottom lens for an immersion exposure tool includes a hydrophobic coating on the sidewalls of the bottom lens. A bottom portion of the bottom lens is not coated with the hydrophobic coating to maintain the optical performance of the bottom lens and to not distort a pattern that is to be transferred to a substrate. The hydrophobic coating may reduce the thermal instability of the bottom lens. This may reduce overlay variation during operation of the immersion exposure tool, which may increase manufacturing yield, decrease device failures, and/or decrease rework and repairs.

20 Claims, 5 Drawing Sheets

(56) References Cited

U.S. PATENT DOCUMENTS

| | | |
|---|---|---|
| 10,520,826 B2 | 12/2019 | Pilz et al. |
| 10,520,837 B2 | 12/2019 | Kunnen et al. |
| 2009/0174870 A1 | 7/2009 | De et al. |
| 2018/0181007 A1 | 6/2018 | Gellrich et al. |
| 2021/0255370 A1* | 8/2021 | Anzlowar ............ G03F 7/0005 |
| 2021/0389547 A1* | 12/2021 | Karam .................... G02B 3/14 |
| 2022/0057546 A1* | 2/2022 | Dale .................... G02B 26/005 |
| 2022/0236646 A1 | 7/2022 | Lee |

* cited by examiner

FIG. 5 ically regions of the second conductive layer; and a second via region of the second conductive layer; and a second via region of the second conductive layer; and a second via region of the second conductive layer.

IMMERSION EXPOSURE TOOL

RELATED APPLICATION

This application is a continuation of U.S. patent application Ser. No. 17/248,394, filed Jan. 22, 2021, which is incorporated herein by reference in its entirety.

BACKGROUND

Immersion lithography includes the use of an immersion exposure tool (e.g., an immersion scanner) to transfer a pattern (e.g., a semiconductor device pattern) to a substrate such as a semiconductor wafer. The immersion exposure tool may employ a high refractive index processing fluid between a lens and a substrate to be patterned to increase the numerical aperture of the lens, which may permit smaller structure sizes to be patterned onto the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The performance of an immersion exposure tool may depend on various operating parameters of the immersion exposure tool. As an example, the operating temperature of a bottom lens of the immersion exposure tool may fluctuate during operation of the immersion exposure tool based on the amount of processing fluid in contact with the bottom lens. In particular, the operating temperature of the bottom lens may decrease as the amount of processing fluid in contact the bottom lens increases, and the operating temperature of the bottom lens may increase as the amount of processing fluid in contact the bottom lens decreases. Fluctuations in operating temperature of the bottom lens may result in overlay variation during operation of the immersion exposure tool, which may cause the pattern to be transferred to shift during patterning of a substrate. This can result in misalignment of structures and/or layers on the substrate, which may reduce manufacturing yield, cause device failures, and/or lead to increased rework and repairs.

Some implementations described herein provide a bottom lens for an immersion exposure tool. The bottom lens includes a hydrophobic coating on the sidewalls of the bottom lens. A bottom portion of the bottom lens is not coated with the hydrophobic coating to maintain the optical performance of the bottom lens and to not distort the pattern that is to be transferred to a substrate. The hydrophobic coating may reduce the thermal instability of the bottom lens. This may reduce overlay variation during operation of the immersion exposure tool, which may increase manufacturing yield, decrease device failures, and/or decrease rework and repairs.

Figure 1:
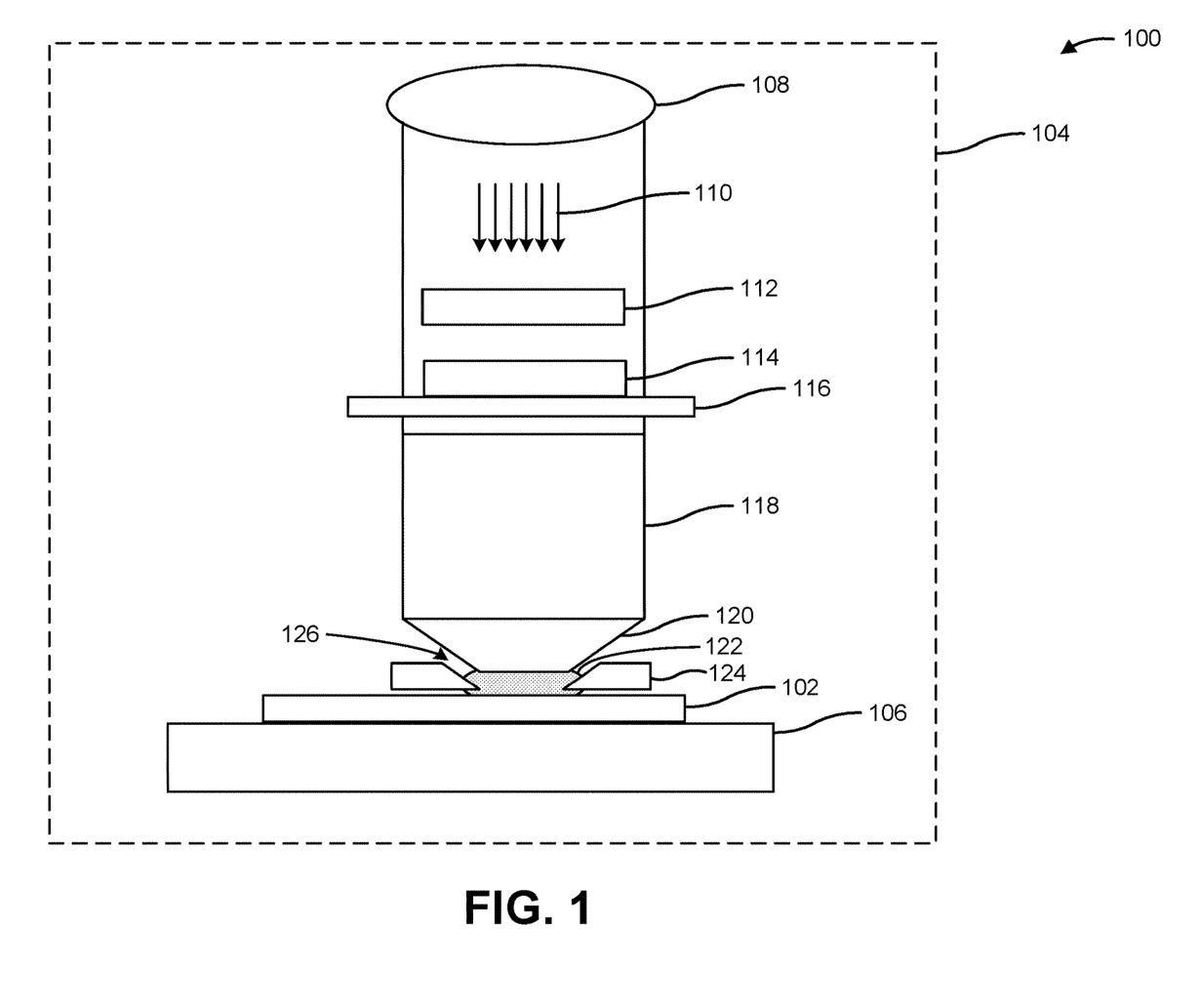
FIGS. 1 and 2 are diagrams of an example immersion exposure tool described herein.
Figure 2:
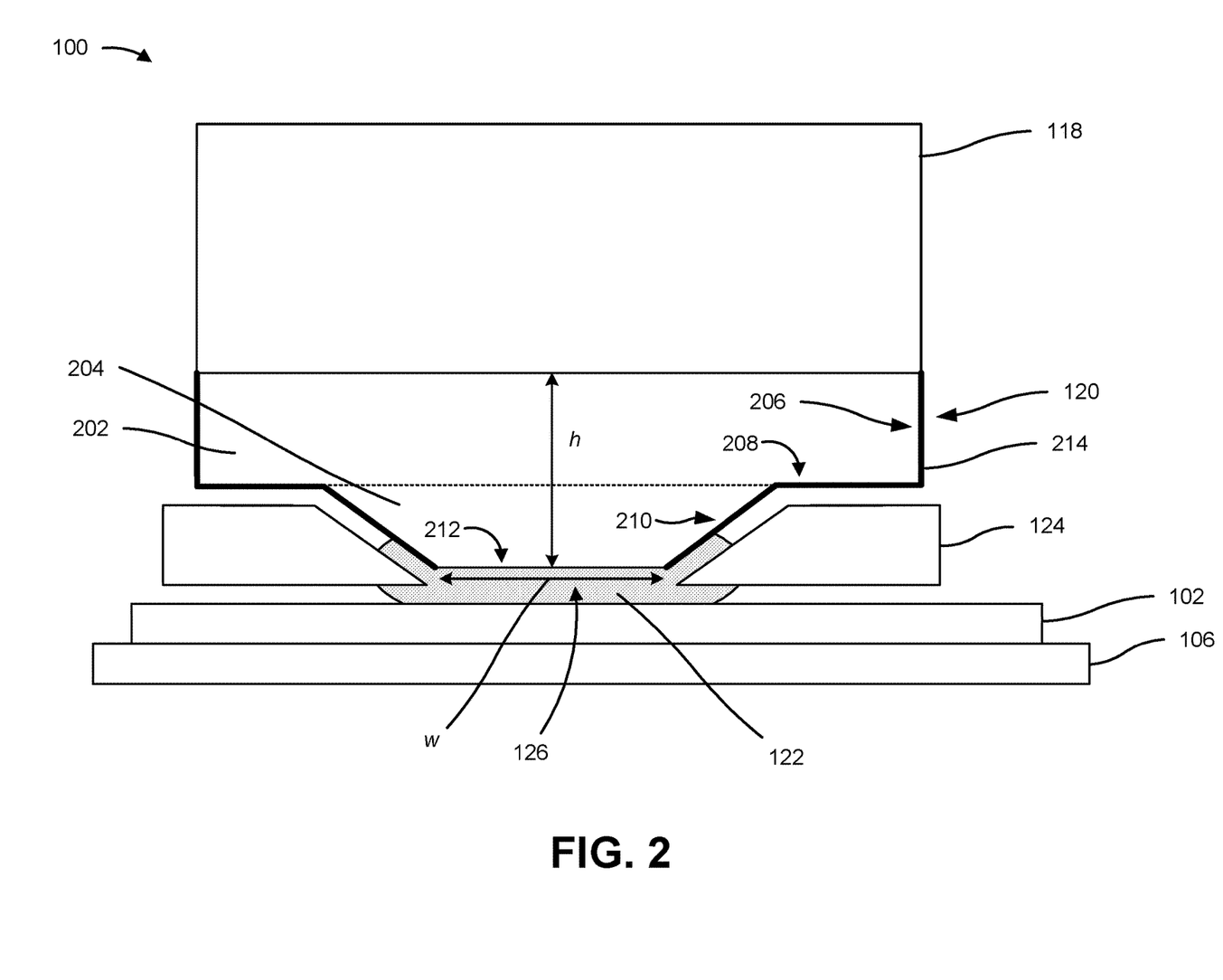

FIGS. 1 and 2 are diagrams illustrating an example immersion exposure tool 100 described herein. The immersion exposure tool 100 may be used in semiconductor immersion lithography to transfer device and/or layer patterns to a photoresist layer on a substrate 102. The substrate 102 may include a semiconductor substrate, such as semiconductor wafer, having an elementary semiconductor material such as crystal silicon, polycrystalline silicon, amorphous silicon, germanium, or diamond, a compound semiconductor material such as silicon carbide or gallium arsenic, an alloy semiconductor material such as silicon germanium (SiGe), gallium arsenide phosphide (GaAsP), aluminum indium arsenide (AlInAs), aluminum gallium arsenide (AlGaAs), or gallium indium phosphorous (GaInP), or a combination thereof. The substrate 102 may be coated with a photoresist layer that is resistive to etch and/or ion implantation and is sensitive to electromagnetic radiation.

As shown in the cross-sectional view in FIG. 1, the immersion exposure tool 100 may include a processing chamber 104 configured to control, reduce, and/or prevent contaminants from reaching the substrate 102. The immersion exposure tool 100 may include a wafer stage 106 in the processing chamber 104. The wafer stage 106 may include a chuck, a platform, or another type of structure configured to support and secure the substrate 102. The immersion exposure tool 100 may operate in various exposure modes, such as a step exposure mode, a scan exposure mode, or a step-and-scan exposure mode. Accordingly, the wafer stage 106 may be configured to provide various motions, such as transitional motion and/or rotational motion to support the various types of exposure modes. The substrate 102 may include a plurality of fields having integrated circuits defined therein for one or more dies. A field includes one or more circuit dies and a frame region at a boundary area. During a lithography exposure operation, the substrate 102 may be exposed one field at a time. For example, the immersion exposure tool 100 may scan an integrated circuit pattern to transfer the integrated circuit pattern to one field, and may then step to a next field (e.g., by moving the wafer stage 106) and may repeat the scanning until all of the fields of the substrate 102 are exhausted.

The immersion exposure tool 100 may include an exposure source (or radiation source) 108 that is configured to emit radiation 110 toward the wafer stage 106 (and thus, the substrate 102 located thereon). The exposure source 108 may include a light source that is capable of generating electromagnetic radiation at or approximately near a particular wavelength of light, such as UV light, deep UV (DUV) light, or extreme UV (EUV) light. In some implementations, the exposure source 108 may include a mercury lamp that is capable of generating a wavelength of electromagnetic radiation of approximately 436 nanometers or approximately 365 nanometers, a Krypton Fluoride (KrF) excimer laser that is capable of generating a wavelength of electromagnetic radiation of approximately 248 nanometers, an Argon Fluoride (ArF) excimer laser that is capable of generating a wavelength of electromagnetic radiation of approximately 193 nanometers, a Fluoride ($F_2$) excimer laser that is capable of generating a wavelength of electromagnetic radiation of approximately 157 nanometers, or another light source that is capable of generating a particular wavelength (e.g., below approximately 100 nanometers) of electromagnetic radiation. In some implementations, the light source is an EUV source having a wavelength of approximately 13.5 nanometers or less.

The immersion exposure tool 100 may include an illumination section 112, which may include one or more condenser lenses, condenser mirrors, illumination slits, and/or other components to condense and direct the radiation 110 toward a photomask 114. The photomask 114 is an apparatus that is used to transfer a pattern (e.g., a die layer pattern, an integrated circuit pattern, among other examples) to a wafer. The photomask 114 may include a lithography mask or a reticle on which a pattern is formed, a frame to which the lithography mask or reticle is attached, and a pellicle layer to protect the pattern from damage and dust that could otherwise cause defects in the transfer of the pattern to the substrate 102.

The photomask 114 may be supported by a photomask stage 116. The photomask stage 116 is configured and designed to secure the photomask 114, for example, by a clamping mechanism such as vacuum chuck or e-chuck. The photomask stage 116 may be further designed to be operable to move for various actions, such as scanning, stepping, among other examples. During a lithography exposure operation, the photomask 114 may be secured on the photomask stage 116 and positioned such that an integrated circuit pattern (or a layer of a pattern) defined thereon may be transferred to or imaged on the photoresist layer coated on the substrate 102.

The immersion exposure tool 100 may include a project lens 118 (or projection lens). The project lens 118 may have a single lens element or a plurality of lens elements configured to provide proper illumination to the photoresist layer on the substrate 102. For example, the project lens 118 may increase or reduce the size of the pattern projected toward the substrate 102 to control the focus of the pattern on the substrate 102 and to control the size of the exposure field on the substrate 102.

The immersion exposure tool 100 may include a bottom lens 120 between the project lens 118 and the wafer stage 106. As described above, the immersion exposure tool 100 is configured to perform immersion lithography. Accordingly, a processing fluid 122 may be provided between the project lens 118 and the substrate 102 to increase the optical refractive index of the immersion exposure tool 100 and to enhance the optical resolution of the immersion exposure tool 100. The bottom lens 120 may be configured to protect the project lens 118 from contamination by contaminants in the processing fluid 122 before, during, and/or after an exposure operation of the immersion exposure tool 100. In this way, the bottom lens 120 may reduce the frequency of maintenance and cleaning of the project lens 118.

The immersion exposure tool 100 may include an immersion hood 124. The immersion hood 124 may be mounted to the bottom lens 120 and/or to another part of the immersion exposure tool 100. The immersion hood 124 may include a ring-shaped structure having an open center such that the radiation 110 may travel through the bottom lens 120, through the opening in the immersion hood 124, and toward the substrate 102. The area in the opening of the immersion hood 124 between the bottom lens 120 and the substrate 102 may be referred to as a processing area 126. The immersion hood 124 may be configured to supply the processing fluid 122 to the processing area 126, to contain the processing fluid 122 within the processing area 126 during an exposure operation of the immersion exposure tool 100, and to remove or evacuate the processing fluid 122 from the processing area 126. The radiation 110 may travel through the processing area 126 and the processing fluid 122 included therein during the exposure operation. The immersion hood 124 may be configured to continuously cycle the processing fluid 122 through the processing area 126 so that fresh processing fluid is continuously supplied to the processing area 126 when the immersion exposure tool 100 is in operation.

The processing fluid 122 may include an optically clear liquid having a relatively high refractive (e.g., compared to the refractive index of air) such as water, purified water, or deionized water. The increased refractive index (e.g., 1.333 for water) relative to air may increase the angle of refraction of the radiation 110 directed toward the substrate 102. The increased angle of refraction may cause the radiation 110 to be condensed into a smaller area, which enables the immersion exposure tool 100 to transfer smaller pattern sizes onto the photoresist layer of the substrate 102.

A distance between the bottom lens 120 and the immersion hood 124 may be equal to or greater than approximately 30 microns. A height (or thickness) of the immersion hood 124 may be equal to or greater than approximately 30 millimeters. A distance between the immersion hood 124 and the wafer 102 may be equal to or greater than approximately 100 microns.

FIG. 2 shows a close-up cross-sectional view of a portion of the immersion exposure tool 100, including the wafer stage 106, the project lens 118, the bottom lens 120, the processing fluid 122, the immersion hood 124, and the processing area 126. As shown in FIG. 2, the bottom lens 120 may include an upper portion 202 and a lower portion 204. The upper portion 202 may include an approximately straight portion having approximately straight sidewalls 206 that connect to bottom walls 208 of the upper portion 202 at approximate right angles.

The lower portion 204 may include a tapered portion having tapered sidewalls 210 that taper down from the bottom walls 208 to a bottom surface 212 of the lower portion 204 (which is also the bottom surface of the bottom lens 120). The angle of the tapered sidewalls 210 may be based on an exposure field size range for the immersion exposure tool 100, based on the size of one or more lens components included in the upper portion 202 and/or in the lower portion 204 of the bottom lens 120, based on a size reduction in the pattern that is to be transferred to the substrate 102 as the pattern is carried by the radiation 110 from the project lens 118 through the bottom lens 120, and/or based on another parameter. In some implementations, at least a portion of the bottom surface 212 includes an optically clear wall that permits the radiation 110 to travel through the bottom surface 212 of the bottom lens 120. In some implementations, at least a portion of the bottom surface 212 includes a lens component of the bottom lens 120.

The bottom lens 120 may absorb some of the radiation 110 traveling through the bottom lens 120 when the immersion exposure tool 100 is in operation. The energy of the absorbed radiation 110 is released into the bottom lens 120 as heat, which causes the temperature of the bottom lens 120 to increase. The thermal transfer of heat continues from the bottom lens 120 to the processing fluid 122, which causes the temperature of the bottom lens 120 to decrease and the temperature of the processing fluid 122 to increase. The volume of processing fluid 122 in the processing area 126 may vary during an exposure operation and/or across multiple exposure operations.

The difference in volume of processing fluid 122 in the processing area 126 results in a greater amount of the bottom lens 120 being in contact with the processing fluid 122 in some cases (such as when a greater volume of the processing fluid 122 is in the processing area 126), while resulting in a lesser amount of the bottom lens 120 being in contact with the processing fluid 122 in other cases (such as when a lesser volume of the processing fluid 122 is in the processing area 126). When the bottom lens 120 is in contact with a greater volume of the processing fluid 122, a greater amount of heat is thermally transferred from the bottom lens 120 to the processing fluid 122 through a larger surface area. This results in a greater amount of cooling of the bottom lens 120 and, thus, a lower temperature of the bottom lens 120. Conversely, when the bottom lens 120 is in contact with a lesser volume of the processing fluid 122, a lesser amount of heat is thermally transferred from the bottom lens 120 to the processing fluid 122 through a smaller surface area. This results in a lower amount of cooling of the bottom lens 120 and, thus, a higher temperature of the bottom lens 120.

As shown in FIG. 2, a hydrophobic coating 214 may be included on the bottom lens 120 to prevent direct contact between the processing fluid 122 and at least a portion of the bottom lens 120. The purpose of the hydrophobic coating 214 is to reduce, minimize, and/or eliminate the transfer of thermal energy (e.g., heat) between the bottom lens 120 and the processing fluid 122. Reducing, minimizing, and/or eliminating the transfer of heat between the bottom lens 120 and the processing fluid 122 reduces, minimizes, and/or eliminates the temperature variation effect on the bottom lens 120 that might otherwise occur due to varying volumes of processing fluid 122 in the processing area 126. In particular, the hydrophobic coating 214 may be formed of a hydrophobic material having a relatively high heat capacity. The relatively high heat capacity enables the hydrophobic coating 214 to absorb large amounts of heat without a change (e.g., an increase), or with a very slight change (e.g., +/−0.5% or +/−0.25%) in temperature of the hydrophobic coating 214. Since the hydrophobic coating 214 is capable of absorbing large amounts of heat without increasing in temperature, little to no heat may be transferred from the bottom lens 120 to the processing fluid 122 through the hydrophobic coating 214. Accordingly, the hydrophobic coating 214 provides thermal stabilization of the bottom lens 120 by resisting thermal transfer between the bottom lens 120 and the processing fluid 122, regardless of the volume of processing fluid 122 in the processing area 126. This may reduce overlay variation during operation of the immersion exposure tool 100 (e.g., exposure field-to-exposure field alignment variation, layer-to-layer alignment variation), may increase manufacturing yield of the immersion exposure tool 100, may decrease device failures resulting from the immersion exposure tool 100, may reduce downtime of the immersion exposure tool 100, and/or may decrease rework and repairs resulting from the immersion exposure tool 100.

As described above, the hydrophobic coating 214 may be formed of a hydrophobic material (e.g., to repel the processing fluid 122 from the bottom lens 120) having a relatively high heat capacity (e.g., to resist thermal transfer between the processing fluid 122 and the bottom lens 120). Examples of materials that may be used for the hydrophobic coating 214 include, but are not limited to, a fluorocarbon ($C_xF_y$) coating, a hydrocarbon ($C_xH_y$) coating, a silicon oxide ($Si_xO_y$) coating, a hydrosilicon ($Si_xH_y$) coating, a nitrogen oxide ($N_xO_y$) coating, a silicon nitride ($Si_xN_y$) coating, a zinc oxide ($Zn_xO_y$) coating, a fluorine-doped silica ($Si_xO_yF_z$) coating, or a manganese oxide ($Mn_xO_y$) coating. The hydrophobic coating 214 may be formed using one or more semiconductor processing tools such as a deposition tool. For example, the deposition tool may deposit the hydrophobic coating 214 on the bottom lens 120 using a chemical vapor deposition technique, a physical vapor deposition (e.g., sputter deposition) technique, an atomic layer deposition technique, or another deposition technique.

In some implementations, the hydrophobic coating 214 may be formed to a thickness that is equal to or approximately greater than 10 angstroms based on processing capabilities of forming the hydrophobic coating 214 and to provide a sufficient amount of thermal isolation between the bottom lens 120 and the processing fluid 122. In some implementations, the thickness of the hydrophobic coating 214 may be based on various parameters, such as the estimated temperature increase of the bottom lens 120, a heat capacity of the material used for the hydrophobic coating 214, and/or another parameter. For example, a thicker hydrophobic coating 214 may be used in cases where a greater temperature increase of the bottom lens 120 is estimated and/or in cases where the heat capacity of the material used for the hydrophobic coating 214 is lower. As another example, a thinner hydrophobic coating 214 may be used in cases where a lesser temperature increase of the bottom lens 120 is estimated and/or in cases where the heat capacity of the material used for the hydrophobic coating 214 is greater.

The hydrophobic coating 214 may be formed and/or included on one or more sidewalls of the bottom lens 120. For example, the hydrophobic coating 214 may be formed and/or included on the tapered sidewalls 210 of the lower portion 204. In some implementations, the hydrophobic coating 214 is additionally formed and/or included on the straight sidewalls 206 of the upper portion 202 and/or the bottom walls 208 of the upper portion 202. The hydrophobic coating 214 may be formed and/or included on at least a portion of the height (h) of the bottom lens 120 from the bottom surface 212. In other words, the hydrophobic coating

214 may extend from the bottom of the tapered sidewalls 210 adjacent to the bottom surface 212, along the length of the tapered sidewalls 210, along at least a portion of the width of the bottom walls 208, and/or along at least a portion of the length of the straight sidewalls 206 such that a least a portion of the height (h) of the bottom lens 120 is covered by the hydrophobic coating 214.

The amount of the height (h) of the bottom lens 120 that is covered by the hydrophobic coating 214 (and thus, the portion of the tapered sidewalls 210, the portion of the bottom walls 208, and/or the portion of the straight sidewalls 206 that are covered by the hydrophobic coating 214) may be based on various parameters. In some implementations, the amount of the height (h) of the bottom lens 120 that is covered by the hydrophobic coating 214 is in a range of approximately 0.01 millimeter to approximately 1 millimeter of the height (h) of the bottom lens 120 to accommodate an estimated variation in volume of the processing fluid 122 in an exposure operation or across multiple exposure operations. In this way, the hydrophobic coating 214 is formed to at least a portion of the height (h) of the bottom lens 120 to prevent direct contact between the processing fluid 122 and the bottom lens 120 regardless of variation in the volume of the processing fluid 122 in the processing area 126.

The hydrophobic coating 214 may be excluded or omitted from one or more surfaces of the bottom lens 120. In particular, the hydrophobic coating 214 may be excluded or omitted from at least a portion of (or all of) the bottom surface 212. In these examples, the deposition tool, when forming the hydrophobic coating 214 on the one or more sidewalls and/or the bottom walls 208, may refrain from forming the hydrophobic coating 214 on at least a portion of (or all of) the bottom surface 212. The hydrophobic coating 214 may be excluded or omitted from at least a portion of (or all of) the bottom surface 212 to prevent the hydrophobic coating 214 from blocking or reducing the intensity of the radiation 110 traveling through the bottom lens 120. In this way, excluding or omitting the hydrophobic coating 214 from the bottom surface 212 permits the radiation 110 to travel through the bottom surface 212 and toward the substrate 102. In some implementations, the hydrophobic coating 214 is excluded or omitted from the width (w) of the bottom surface 212, which may be in a range of approximately 0.01 millimeter to approximately 33 millimeters for a 193 nanometer ArF excimer laser immersion exposure tool, to permit the radiation 110 to travel through the entire bottom surface 212.

As indicated above, FIGS. 1 and 2 are provided as one or more examples. Other examples may differ from what is described with regard to FIGS. 1 and 2.

Figure 3:
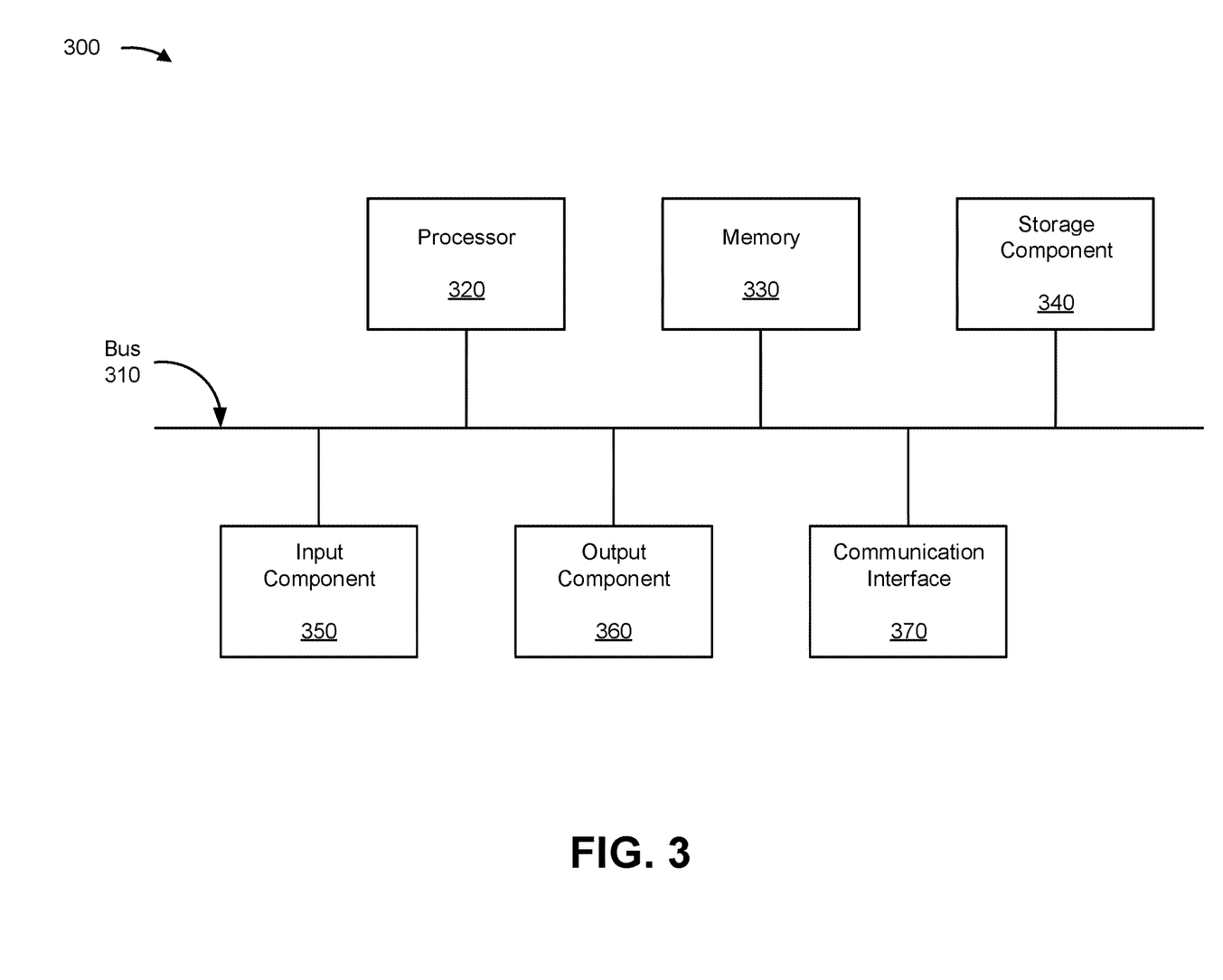
FIG. 3 is a diagram of example components of an example device described herein.

FIG. 3 is a diagram of example components of a device 300 described herein. In some implementations, the immersion exposure tool 100 may include one or more devices 300 and/or one or more components of device 300. As shown in FIG. 3, device 300 may include a bus 310, a processor 320, a memory 330, a storage component 340, an input component 350, an output component 360, and a communication component 370.

Bus 310 includes a component that enables wired and/or wireless communication among the components of device 300. Processor 320 includes a central processing unit, a graphics processing unit, a microprocessor, a controller, a microcontroller, a digital signal processor, a field-programmable gate array, an application-specific integrated circuit, and/or another type of processing component. Processor 320 is implemented in hardware, firmware, or a combination of hardware and software. In some implementations, processor 320 includes one or more processors capable of being programmed to perform a function. Memory 330 includes a random access memory, a read only memory, and/or another type of memory (e.g., a flash memory, a magnetic memory, and/or an optical memory).

Storage component 340 stores information and/or software related to the operation of device 300. For example, storage component 340 may include a hard disk drive, a magnetic disk drive, an optical disk drive, a solid state disk drive, a compact disc, a digital versatile disc, and/or another type of non-transitory computer-readable medium. Input component 350 enables device 300 to receive input, such as user input and/or sensed inputs. For example, input component 350 may include a touch screen, a keyboard, a keypad, a mouse, a button, a microphone, a switch, a sensor, a global positioning system component, an accelerometer, a gyroscope, and/or an actuator. Output component 360 enables device 300 to provide output, such as via a display, a speaker, and/or one or more light-emitting diodes. Communication component 370 enables device 300 to communicate with other devices, such as via a wired connection and/or a wireless connection. For example, communication component 370 may include a receiver, a transmitter, a transceiver, a modem, a network interface card, and/or an antenna.

Device 300 may perform one or more processes described herein. For example, a non-transitory computer-readable medium (e.g., memory 330 and/or storage component 340) may store a set of instructions (e.g., one or more instructions, code, software code, and/or program code) for execution by processor 320. Processor 320 may execute the set of instructions to perform one or more processes described herein. In some implementations, execution of the set of instructions, by one or more processors 320, causes the one or more processors 320 and/or the device 300 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 3 are provided as an example. Device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
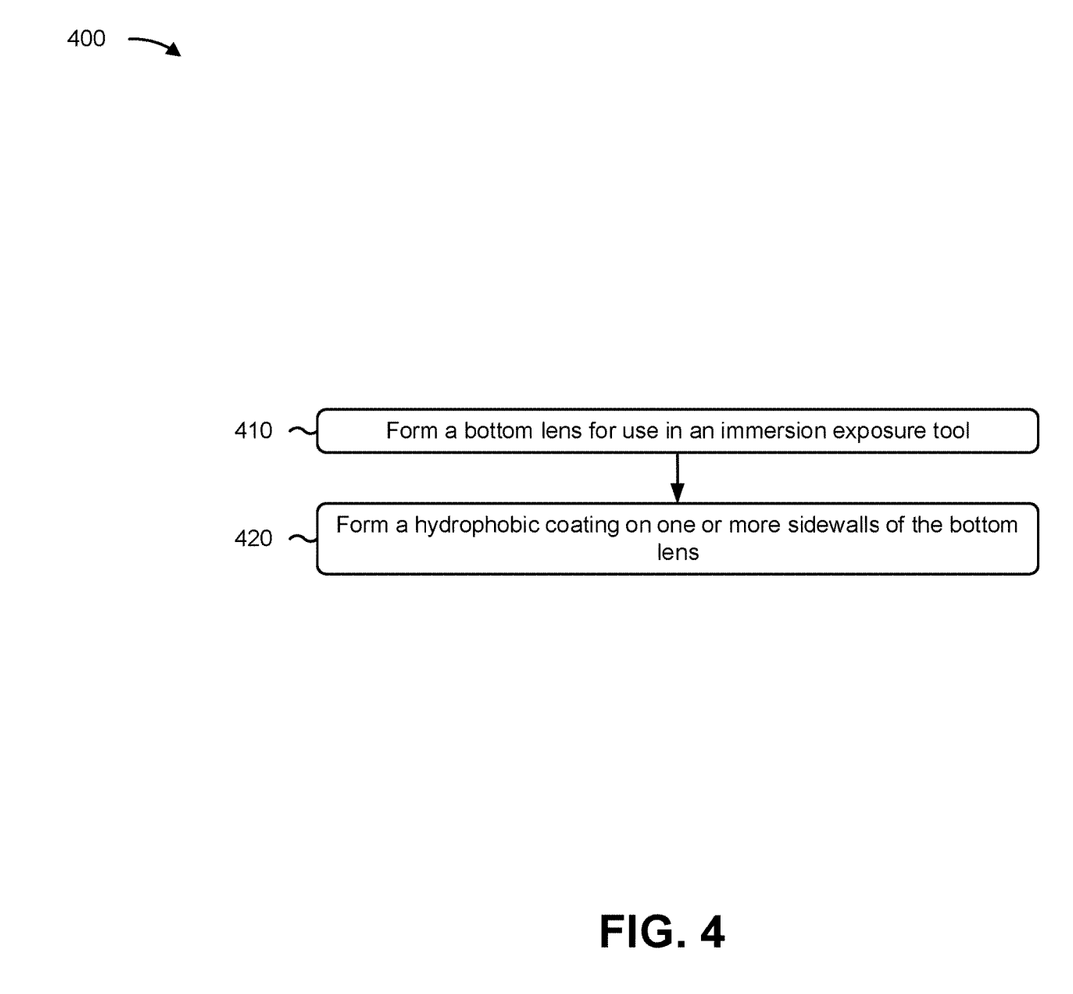
FIG. 4 is a flowchart of an example process relating to forming a hydrophobic coating on a bottom lens of an immersion exposure tool.

FIG. 4 is a flowchart of an example process 400 relating to forming a hydrophobic coating on a bottom lens of an immersion exposure tool. In some implementations, one or more process blocks of FIG. 4 may be performed by a semiconductor processing tool. Additionally, or alternatively, one or more process blocks of FIG. 4 may be performed by one or more components of device 300, such as processor 320, memory 330, storage component 340, input component 350, output component 360, and/or communication component 370.

As shown in FIG. 4, process 400 may include forming a bottom lens for use in an immersion exposure tool (block 410). For example, the semiconductor processing tool may form the bottom lens 120 for use in the immersion exposure tool 100, as described above.

As further shown in FIG. 4, process 400 may include forming a hydrophobic coating on one or more sidewalls of the bottom lens (block 420). For example, a semiconductor processing tool (e.g., a chemical vapor deposition (CVD)

tool, a sputter deposition tool, or another type of semiconductor processing tool) may form the hydrophobic coating 214 on one or more sidewalls (e.g., sidewall 206, sidewall 210) of the bottom lens 120, as described above.

Process 400 may include additional implementations, such as any single implementation or any combination of implementations described below and/or in connection with one or more other processes described elsewhere herein.

In a first implementation, forming the hydrophobic coating 214 on the one or more sidewalls (e.g., sidewall 206, sidewall 210) of the bottom lens 120 includes forming the hydrophobic coating 214 on at least a portion of the bottom lens 120 including a range of approximately 0.01 millimeter to approximately 1 millimeter of a height (h) of the bottom lens 120. In a second implementation, alone or in combination with the first implementation, forming the hydrophobic coating 214 on the one or more sidewalls (e.g., sidewall 206, sidewall 210) of the bottom lens 120 includes forming the hydrophobic coating 214 on a plurality of sidewalls (e.g., sidewall 206, sidewall 210) of the bottom lens while refraining from forming the hydrophobic coating 214 on the bottom surface 212 of the bottom lens 120 to permit the radiation 110 of the immersion exposure tool 100 to pass through the bottom surface 212 of the bottom lens 120.

In a third implementation, alone or in combination with one or more of the first and second implementations, a width of the bottom surface 212 of the bottom lens 120 is in a range of approximately 0.01 millimeter to approximately 33 millimeters. In a fourth implementation, alone or in combination with one or more of the first through third implementations, forming the hydrophobic coating 214 on the one or more sidewalls (e.g., sidewall 206, sidewall 210) of the bottom lens 120 includes forming the hydrophobic coating 214 using a sputter deposition technique. In a fifth implementation, alone or in combination with one or more of the first through fourth implementations, forming the hydrophobic coating 214 on the one or more sidewalls (e.g., sidewall 206, sidewall 210) of the bottom lens 120 includes forming the hydrophobic coating 214 using a CVD technique.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
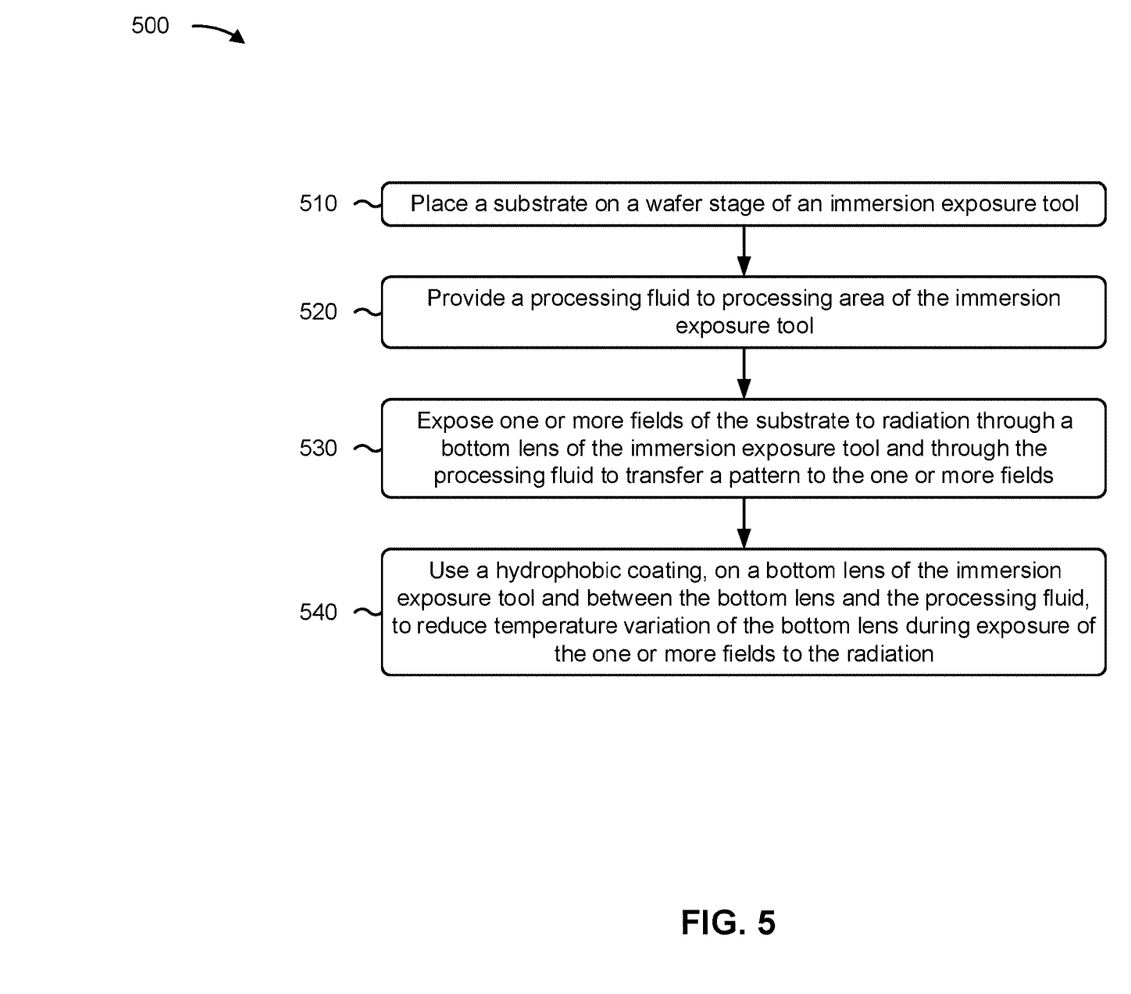
FIG. 5 is a flowchart of an example process relating to operating an immersion exposure tool.

FIG. 5 is a flowchart of an example process 500 relating to operating an immersion exposure tool. In some implementations, one or more process blocks of FIG. 5 may be performed by an immersion exposure tool (e.g., the immersion exposure tool 100). Additionally, or alternatively, one or more process blocks of FIG. 5 may be performed by one or more components of device 300, such as processor 320, memory 330, storage component 340, input component 350, output component 360, and/or communication component 370.

As shown in FIG. 5, process 500 may include placing a substrate (e.g., the substrate 102) on a wafer stage (e.g., the wafer stage 106) of an immersion exposure tool (e.g., the immersion exposure tool 100) (block 510). As further shown in FIG. 5, process 500 may include providing a processing fluid (e.g., the processing fluid 122) to a processing area (e.g., the processing area 126) of the immersion exposure tool (block 520).

As further shown in FIG. 5, process 500 may include exposing one or more fields of the substrate to radiation (e.g., the radiation 110) through a bottom lens (e.g., the bottom lens 12) of the immersion exposure tool to transfer a pattern to the one or more fields (block 530). As further shown in FIG. 5, process 500 may include using a hydrophobic coating (e.g., the hydrophobic coating 214), on the bottom lens and between the bottom lens and the processing fluid, to reduce temperature variation of the bottom lens during exposure of the one or more fields to the radiation (block 540).

Process 500 may include additional implementations, such as any single implementation or any combination of implementations described below and/or in connection with one or more other processes described elsewhere herein.

In a first implementation, the bottom lens includes a straight portion configured to be orientated toward a project lens of the immersion exposure tool and a tapered portion configured to be orientated toward a wafer stage associated with the immersion exposure tool. In a second implementation, alone or in combination with the first implementation, the hydrophobic coating is included on a sidewall of the tapered portion and not on a bottom surface of the tapered portion, and on a sidewall of the straight portion. In a third implementation, alone or in combination with one or more of the first or second implementations, process 500 includes exposing the one or more fields of the substrate to radiation through the bottom lens of the immersion exposure tool to transfer a second pattern to the one or more fields, where a hydrophobic coating on a bottom lens of the immersion exposure tool reduces overlay variation between transfer of the pattern to the one or more fields and transfer of the second pattern to the one or more fields.

In a fourth implementation, alone or in combination with one or more of the first through third implementations, the hydrophobic coating includes at least one of a nitrogen oxide ($N_xO_y$) coating, a silicon nitride ($Si_xN_y$) coating, a zinc oxide ($Zn_xO_y$) coating, or a fluorine-doped silica ($Si_xO_yF_z$) coating. In a fifth implementation, alone or in combination with one or more of the first though fifth implementations, a thickness of the hydrophobic coating is equal to or greater than approximately 10 angstroms. In a sixth implementation, alone or in combination with one or more of the first through fifth implementations, the hydrophobic coating is on a first surface and not on a second surface of a tapered portion of the bottom lens.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

In this way, a bottom lens for an immersion exposure tool includes a hydrophobic coating on sidewalls of the bottom lens. A bottom portion of the bottom lens is not coated with the hydrophobic coating to maintain the optical performance of the bottom lens and to not distort the pattern that is to be transferred to a substrate. The hydrophobic coating may reduce the thermal instability of the bottom lens. This may reduce overlay variation during operation of the immersion exposure tool, which may increase manufacturing yield, decrease device failures, and/or decrease rework and repairs.

As described in greater detail above, some implementations described herein provide a method. The method includes placing a substrate on a wafer stage of an immersion exposure tool. The method includes providing a processing fluid to processing area of the immersion exposure tool. The method includes exposing one or more fields of the substrate to radiation through a bottom lens of the immersion exposure tool and through the processing fluid to transfer a pattern to the one or more fields. The method includes using a hydrophobic coating, on a bottom lens of the immersion exposure tool and between the bottom lens and the processing fluid, to reduce temperature variation of the bottom lens during exposure of the one or more fields to the radiation.

As described in greater detail above, some implementations described herein provide an immersion exposure tool. The immersion exposure tool includes a project lens. The immersion exposure tool includes a bottom lens adjacent to the project lens. The immersion exposure tool includes an immersion hood around the bottom lens. The immersion exposure tool includes a hydrophobic coating on a sidewall of the bottom lens.

As described in greater detail above, some implementations described herein provide a bottom lens for use in an immersion exposure tool. The bottom lens includes a straight portion configured to be orientated toward a project lens of the immersion exposure tool. The bottom lens includes a tapered portion configured to be orientated toward a wafer stage associated with the immersion exposure tool. The bottom lens includes a hydrophobic coating on the tapered portion.

As described in greater detail above, some implementations described herein provide a method. The method includes forming a bottom lens for use in an immersion exposure tool. The method includes forming a hydrophobic coating on one or more sidewalls of the bottom lens.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a processing fluid to a processing area of an immersion exposure tool; and
   transmitting radiation through a bottom lens of the immersion exposure tool and through the processing fluid, to a wafer, under the processing area,
   wherein the bottom lens comprises:
      an upper portion comprising straight sidewalls and straight bottom walls connecting to the straight sidewalls, and
      a lower portion comprising tapered sidewalls extending from the straight bottom walls,
         wherein the tapered sidewalls, and at least one of the straight sidewalls or the straight bottom walls, comprise a hydrophobic coating.

2. The method of claim 1, wherein the radiation is transmitted through an optically clear portion of the bottom lens.

3. The method of claim 1, wherein the radiation transfers a pattern to the wafer.

4. The method of claim 3, wherein the radiation is transmitted through a photomask of the immersion exposure tool to transfer the pattern.

5. The method of claim 3, wherein the radiation is transmitted through a projection lens of the immersion exposure tool that focuses the pattern on the wafer.

6. The method of claim 1, wherein the processing fluid is provided by an immersion hood spaced away from the tapered sidewalls of the lower portion of the bottom lens and from the straight bottom walls of the upper portion of the bottom lens.

7. An immersion exposure tool, comprising:
   a projection lens;
   a bottom lens comprising:
      an upper portion comprising straight sidewalls and straight bottom walls connecting to the straight sidewalls, and
      a lower portion comprising tapered sidewalls extending from the straight bottom walls;
   an immersion hood around the lower portion of the bottom lens; and
   a hydrophobic coating on the tapered sidewalls and at least one of the straight sidewalls or the straight bottom walls.

8. The immersion exposure tool of claim 7, wherein the hydrophobic coating is on the straight sidewalls or the straight bottom walls.

9. The immersion exposure tool of claim 7, wherein a height of the bottom lens, from a bottom surface of the bottom lens, covered by the hydrophobic coating is in a range of approximately 0.01 millimeter to approximately 1 millimeter.

10. The immersion exposure tool of claim 7, wherein a thickness of the hydrophobic coating is equal to or greater than approximately 10 angstroms.

11. The immersion exposure tool of claim 7, wherein a thickness of the hydrophobic coating is based on one or more of: an estimated increase in temperature of the bottom lens, or a heat capacity of the hydrophobic coating.

12. The immersion exposure tool of claim 7, wherein the lower portion has a bottom surface that is at least partially optically clear.

13. The immersion exposure tool of claim 12, wherein at least a portion of the bottom surface comprises a lens component.

14. A method, comprising:
   forming a bottom lens for use in an immersion exposure tool,
      wherein the bottom lens comprises:
         an upper portion comprising straight sidewalls and straight bottom walls connecting to the straight sidewalls, and
         a lower portion comprising tapered sidewalls extending from the straight bottom walls; and
   forming a hydrophobic coating on the tapered sidewalls and at least one of the straight sidewalls or the straight bottom walls.

15. The method of claim 14, wherein an angle of the tapered sidewalls is based on at least one of:
   an exposure field size range of the immersion exposure tool,
   a size of one or more lens components included in one or more of the upper portion or the lower portion of the bottom lens, or
   a size reduction in a pattern that is to be transferred to a wafer as the pattern is carried by radiation from a projection lens through the bottom lens.

16. The method of claim 14, wherein the bottom lens has a bottom surface, between the tapered sidewalls, that has at least a portion that is free from the hydrophobic coating.

17. The method of claim 16, wherein a width of the bottom surface is approximately 0.01 millimeter to approximately 33 millimeters.

18. The method of claim 16, wherein the portion of the bottom surface is optically clear.

19. The method of claim 14, wherein the hydrophobic coating is formed on a height of the bottom lens, from a bottom surface of the bottom lens, that is from approximately 0.01 millimeter to approximately 1 millimeter.

20. The method of claim 14, wherein the hydrophobic coating comprises:
 a fluorocarbon ($C_xF_y$) coating,
 a hydrocarbon ($C_xH_y$) coating,
 a silicon oxide ($Si_xO_y$) coating,
 a hydrosilicon ($Si_xH_y$) coating,
 a nitrogen oxide ($N_xO_y$) coating,
 a silicon nitride ($Si_xN_y$) coating,
 a zinc oxide ($Zn_xO_y$) coating,
 a fluorine-doped silica ($Si_xO_yF_z$) coating, or
 a manganese oxide ($Mn_xO_y$) coating.

\* \* \* \* \*